(12) United States Patent
Peng et al.

(10) Patent No.: US 10,875,148 B2
(45) Date of Patent: Dec. 29, 2020

(54) APPARATUS AND METHODS FOR CHEMICAL MECHANICAL POLISHING

(71) Applicant: TAIWAN SEMICONDUCTOR MANUFACTURING COMPANY LTD., Hsinchu (TW)

(72) Inventors: He Hui Peng, Changhua County (TW); James Jeng-Jyi Hwang, Hsin-Chu County (TW); Chi-Ming Yang, Hsinchu (TW); Yung-Yao Lee, Hsinchu County (TW); Yen-Di Tsen, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/003,154

(22) Filed: Jun. 8, 2018

(65) Prior Publication Data
US 2019/0375071 A1  Dec. 12, 2019

(51) Int. Cl.
*H01L 21/4763* (2006.01)
*B24B 53/017* (2012.01)
*B24B 37/04* (2012.01)
*H01L 21/321* (2006.01)
*H01L 21/768* (2006.01)
*H01L 23/532* (2006.01)

(52) U.S. Cl.
CPC .......... *B24B 53/017* (2013.01); *B24B 37/042* (2013.01); *H01L 21/3212* (2013.01); *H01L 21/7684* (2013.01); *H01L 23/53228* (2013.01)

(58) Field of Classification Search
None
See application file for complete search history.

(56) References Cited

U.S. PATENT DOCUMENTS

| | | | |
|---|---|---|---|
| 7,837,534 B2 † | 11/2010 | Aiyoshizawa | |
| 7,840,305 B2 * | 11/2010 | Behr | B24B 49/02 438/5 |
| 2012/0058709 A1 * | 3/2012 | Fukushima | B24B 37/10 451/5 |
| 2015/0079881 A1 † | 3/2015 | Maruyama | |
| 2016/0236318 A1 * | 8/2016 | Choi | B24B 55/02 |
| 2017/0239778 A1 † | 8/2017 | Maruyama | |

\* cited by examiner
† cited by third party

*Primary Examiner* — Hung K Vu
(74) *Attorney, Agent, or Firm* — WPAT; P.C., Intellectual Property Attorneys; Anthony King (57) ABSTRACT

An apparatus for CMP includes a wafer carrier retaining a semiconductor wafer during a polishing operation, a slurry dispenser dispensing an abrasive slurry, and a temperature control system monitoring and controlling a temperature variation during the polishing operation. The temperature control system includes a temperature sensor detecting a temperature during the polishing operation and providing a signal corresponding to the temperature, a temperature controller coupled to the temperature sensor and receiving the signal from the temperature sensor, and a cooling device coupled to the temperature controller and providing a coolant to the apparatus for CMP.

18 Claims, 8 Drawing Sheets

APPARATUS AND METHODS FOR CHEMICAL MECHANICAL POLISHING

BACKGROUND

Chemical mechanical polishing (CMP) is widely used in the fabrication of integrated circuits. As an integrated circuit is built up layer by layer on a surface of a semiconductor wafer, CMP is used to planarize the topmost layer or layers to provide a level surface for subsequent fabrication operations. CMP is carried out by placing the semiconductor wafer in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical forces.

CMP can be used at a number of time points during the fabrication of an integrated circuit. For example, CMP may be used to planarize the inter-level dielectric layers that separate the various circuit layers in an integrated circuit. CMP is also commonly used in the formation of the conductive lines of interconnect components in an integrated circuit. By abrasively polishing the surface of the semiconductor wafer, excess material and surface roughness in layers can be removed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to +10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 00 that is less than or equal to ±100, such as less than or equal to ±50, less than or equal to ±40, less than or equal to ±30, less than or equal to ±20, less than or equal to ±10, less than or equal to ±0.50, less than or equal to ±0.10, or less than or equal to ±0.050. For example, "substantially" perpendicular can refer to a range of angular variation relative to 900 that is less than or equal to 100, such as less than or equal to ±50, less than or equal to ±40, less than or equal to ±30, less than or equal to ±20, less than or equal to ±10, less than or equal to ±0.50, less than or equal to 0.1°, or less than or equal to ±0.050.

In some embodiments, CMP is used to remove excess conductive material after filling vias and trench lines with the conductive material, for example copper (Cu), to electrically interconnect the several layers and areas that make up a multi-layer semiconductor device. Several semiconductor feature defects can be associated with metal polishing. For example, during the metal CMP, metal is removed or eroded at a rate greater than the surrounding field of insulating dielectric. This causes a topography difference between insulating dielectric and the metal features, typically referred to as corrosion. Such corrosion can lead to excess removal of metal such that overlying formation of electrical interconnecting features, for example, stacked vias, leads to electrical failure by causing discontinuous electrical communication pathways. In some embodiments, it is found that a metal line end in an iso region (i.e., a lower density region) may be polished at a rate greater than a metal line end in a dense region (i.e., a higher density region) during the metal CMP.

In some embodiments, CMP slurry recipe and/or CMP pad material may be modified to mitigate the metal corrosion issue in iso regions. However those approaches suffer from long evaluation time. In some embodiments, dummy metals may be added and inserted in the iso region to mitigate the metal corrosion issue. However, such solution is limited by product design rules, and process complexity may be increased.

The present disclosure therefore provides a temperature-controlled CMP apparatus that is able to mitigate metal corrosion. By introducing a temperature control system, such as a cooling system, to the apparatus, temperature is monitored and controlled in real time. Consequently, CMP removal rate (RR) in an iso region is reduced and thus metal corrosion in the iso region is mitigated.

Figure 1:
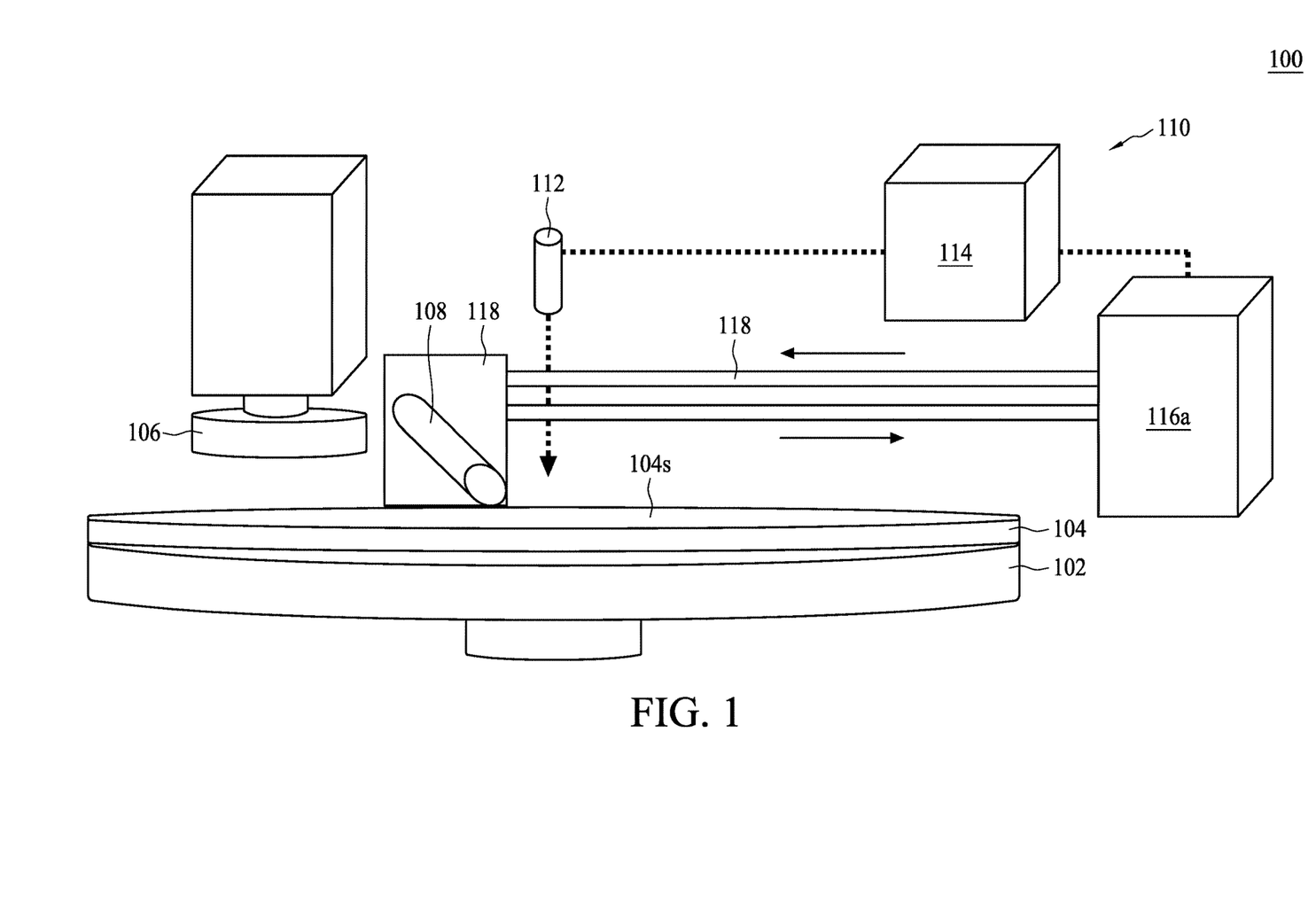
FIG. 1 is a schematic drawing illustrating an apparatus for CMP according to aspects of one or more embodiments of the present disclosure.

FIG. 1 is a schematic drawing illustrating an apparatus for CMP 100 according to aspects of one or more embodiments of the present disclosure. The apparatus for CMP 100 includes a platen 102 configured to rotate in at least one direction, a polishing pad 104 provided on a top of the platen 102, a wafer carrier (sometimes referred to as a polishing head) 106 configured to support a semiconductor wafer, and a slurry dispenser 108 configured to dispense or deliver an abrasive slurry to the polishing pad 102 to facilitate removal of materials from the semiconductor wafer. The apparatus for CMP 100 further includes a temperature control system 110 configured to monitor and control a temperature variation, as shown in FIG. 1.

In some embodiments, the platen 102 is configured to rotate in one or more directions. In some embodiments, the platen 102 is configured to be held stationary. In some embodiments, the platen 102 is configured to have a constant rotational speed. In alternative embodiments, the platen 102 is configured to have a variable rotational speed. The platen 102 can be rotated by a motor (not shown). In some embodiments, the motor can be an alternating current (AC) motor, a direct current (DC) motor, a universal motor, or another suitable motor. The platen 102 is configured to support the polishing pad 104, as shown in FIG. 1.

The polishing pad 104 is coupled to the platen 102 such that the polishing pad 104 is rotated in a same direction at a same speed as the platen 102. The polishing pad 104 includes a polishing surface 104s, such as a texture surface, which is configured to remove materials from the semiconductor wafer during operation of the apparatus for CMP 100.

The wafer carrier 106 is configured to support and retain the semiconductor wafer proximate to the polishing surface 104s of the polishing pad 104 during a polishing operation.

In some embodiments, the wafer carrier 106 includes a retaining ring to secure the semiconductor wafer. In some embodiments, the wafer carrier 106 includes a vacuum to secure the semiconductor wafer. The wafer carrier 106 is configured to rotate in a direction the same as or different from the platen 102. In some embodiments, the wafer carrier 106 is rotated in a direction opposite to the direction of the rotation of the platen 102. In some embodiments, the wafer carrier 106 is configured to have a constant rotational speed. In alternative embodiments, the wafer carrier 106 is configured to have a variable rotational speed. The wafer carrier 106 can be rotated by a motor (not shown). In some embodiments, the motor can be an AC motor, a DC motor, a universal motor, or another suitable motor.

The wafer carrier 106 can be moved in a direction perpendicular to the polishing surface 104s of the polishing pad 104. By moving the semiconductor wafer carrier 106 in the direction perpendicular to the polishing surface 104s, a pressure exerted on the semiconductor wafer by the polishing pad 104 is adjustable. In some embodiments, the apparatus for CMP 100a can include pressure sensors (not shown) to monitor the pressure exerted on the semiconductor wafer. In some embodiments, the apparatus for CMP 100 can include a pressure control system (not shown) to exert force on the semiconductor wafer to adjust the pressure exerted on the semiconductor wafer at various locations of the semiconductor wafer. In some embodiments, the pressure control system can include nozzles configured to emit pressurized gas, translatable pins or other suitable force-exerting elements.

The slurry dispenser 108 is configured to dispense the abrasive slurry onto the polishing surface 104s of the polishing pad 104. The slurry dispenser 108 includes at least one nozzle (not shown) configured to dispense the abrasive slurry. In some embodiments, the apparatus for CMP 100 can include a slurry mix system (not shown) configured to mix various fluid compositions prior to dispensing the mixture to the polishing surface 104s of the polishing pad 104.

In some embodiments, the semiconductor wafer is held inside the wafer carrier 106 with upward suction applied to the wafer's backside. The platen 102 is rotated, and the polishing pad 104 is correspondingly rotated. The abrasive slurry is then dispensed onto the polishing surface 104s. The wafer carrier 106 is then rotated and lowered toward the polishing pad 104. When the rotation of the wafer carrier 106 reaches a wafer-polishing speed, the semiconductor wafer is pressed to contact the polishing surface 104s. This dual rotation, in the presence of the downward force applied to the semiconductor wafer and the abrasive slurry, causes the semiconductor wafer to be gradually planarized.

The temperature control system 110 of the apparatus for CMP 100 includes a temperature sensor 112, a temperature controller 114, and a cooling device 116a, 116b or 116c. The temperature sensor 112 is configured to detect a temperature of the polishing surface 104s of the polishing pad 104, and to provide a signal corresponding to the temperature of the polishing surface 104s. In some embodiments, the temperature sensor 112 can include an infra-red (IR) sensor, but the disclosure is not limited thereto. The temperature controller 114 is coupled to the temperature sensor 112 and the cooling device 116a, as shown in FIG. 1. The cooling device 116a is configured to provide a coolant to the CMP tool 100. In some embodiments, the cooling device 116a includes a loop 118 capable of circulating the coolant. In some embodiments, the loop 118 of the cooling device 116a is coupled to the slurry dispenser 108. In some embodiments, the temperature controller 114 is configured to receive the signal from the temperature sensor 112 and to instruct the cooling device 116a to provide the coolant or to stop providing the coolant according to the signal from the temperature sensor 112. In other words, based on the signals corresponding to the temperature from the temperature sensor 112, the temperature controller 114 can make real-time changes during the polishing operation. In some embodiments, the cooling device 116a is instructed to provide the coolant to the slurry dispenser 108 through the loop 118. In some embodiments, the cooling device 116a is instructed to stop providing the coolant to the slurry dispenser 108 and to retrieve the coolant through the loop 118. The coolant can be a gas or a fluid flowing in the loop 118.

As shown in FIG. 1, the cooling device 116a is coupled to the slurry dispenser 108 to reduce a temperature of the abrasive slurry. When the abrasive slurry is dispensed onto the polishing surface 104s of the polishing pad 104, it immediately reduces the temperature of the polishing surface 104s.

Figure 2:
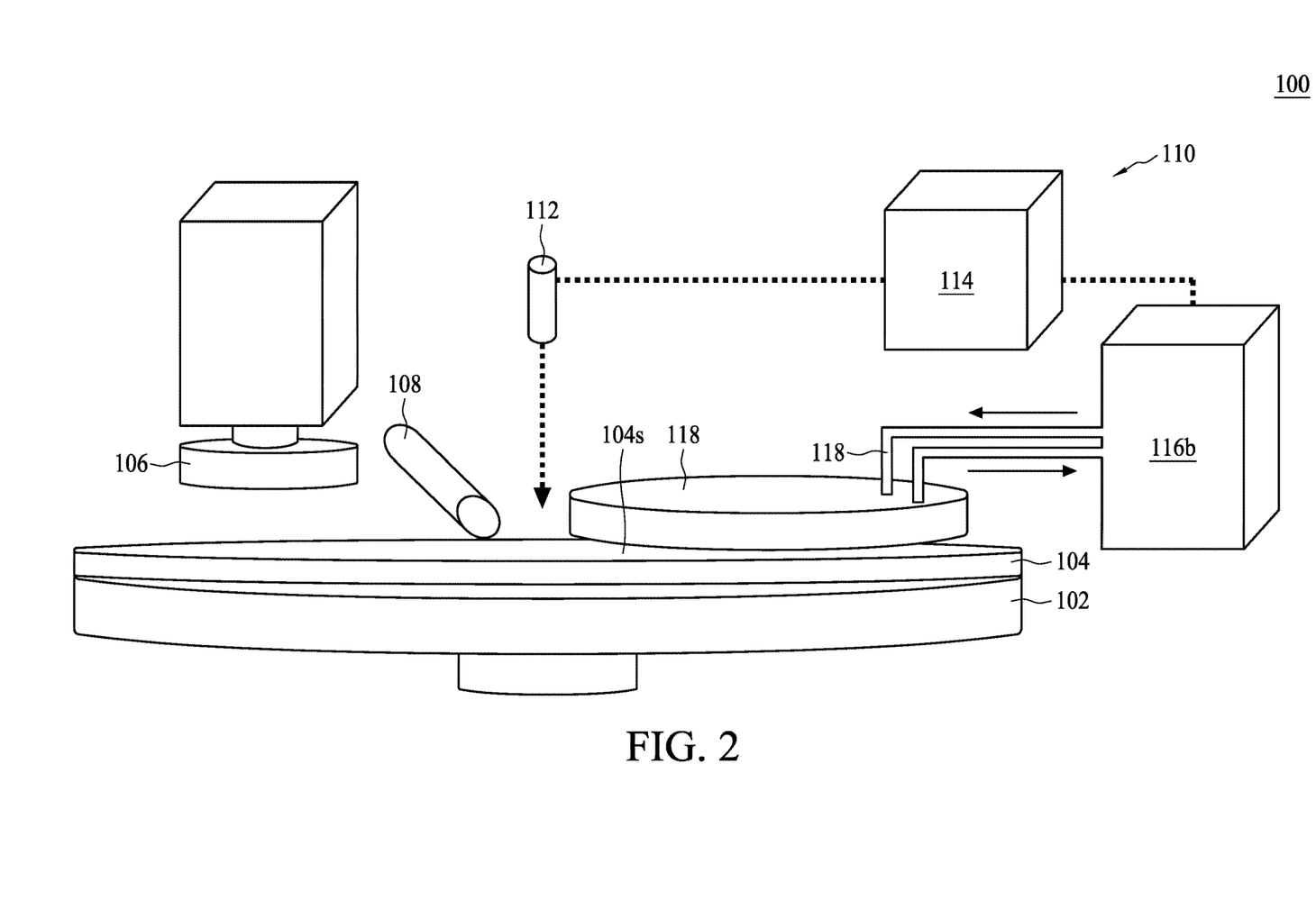
FIG. 2 is a schematic drawing illustrating an apparatus for CMP according to aspects of one or more embodiments of the present disclosure.

FIG. 2 is a schematic drawing illustrating an apparatus for CMP 100 according to aspects of one or more embodiments of the present disclosure. It should be noted that similar elements in FIG. 1 and FIG. 2 are designated by the same numerals. Further, similar elements in FIG. 1 and FIG. 2 can perform similar functions; therefore, such redundant details are omitted in the interest of brevity, and only the differences are mentioned. In some embodiments, the temperature control system 110 includes a cooling device 116b, and the cooling device 116b is proximate to the polishing surface 104s of the polishing pad 104. As shown in FIG. 2, the cooling device 116b is placed above the polishing surface 104s without contacting, but the disclosure is not limited thereto. In some embodiments, the cooling device 116b includes a loop 118 capable of circulating the coolant. In some embodiments, the cooling device 116b is instructed to provide the coolant within the loop 118. In some embodiments, the cooling device 116b is instructed to stop providing the coolant and to retrieve the coolant through the loop 118. As shown in FIG. 2, the cooling device 116b is configured to reduce the temperature of the polishing surface 104s by radiation.

Figure 3:
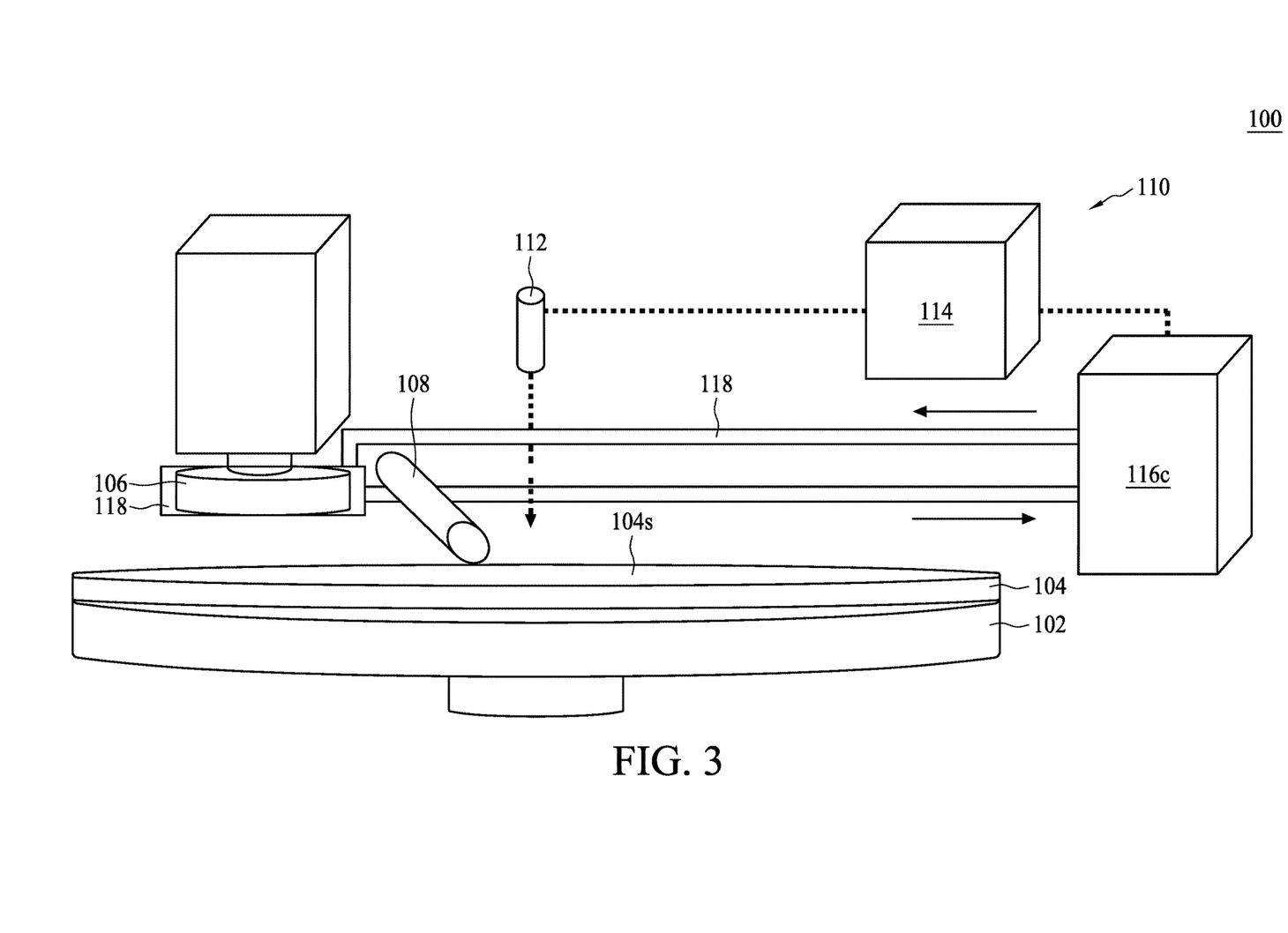
FIG. 3 is a schematic drawing illustrating an apparatus for CMP according to aspects of one or more embodiments of the present disclosure.

FIG. 3 is a schematic drawing illustrating an apparatus for CMP 100 according to aspects of one or more embodiments of the present disclosure. It should be noted that similar elements in FIG. 1 and FIG. 3 are designated by the same numerals. Further, similar elements in FIG. 1 and FIG. 3 can perform similar functions; therefore, such redundant details are omitted in the interest of brevity, and only the differences are mentioned. In some embodiments, the temperature control system 100 includes a cooling device 116c, and a loop 118 of the cooling device 116c is coupled to the wafer carrier 106. In some embodiments, the cooling device 116c is instructed to provide the coolant to the wafer carrier 106 through the loop 118. In some embodiments, the cooling device 116c is instructed to stop providing the coolant to the wafer carrier 106 and to retrieve the coolant through the loop 118.

As shown in FIG. 3, the cooling device 116c is coupled to the wafer carrier 106 to reduce a temperature of the semiconductor wafer. When the semiconductor wafer contacts the polishing surface 104s of the polishing pad 104, it immediately reduces the temperature of the polishing surface 104s.

Accordingly, installation of the cooling device in the apparatus for CMP 100 has at least three approaches. The cooling device 116a can be coupled to the slurry dispenser 108 as shown in FIG. 1, the cooling device 116b can be proximate to but not contacting the polishing surface 104s of the polishing pad 104 as shown in FIG. 2, or the cooling device 116c can be coupled to the wafer carrier 106 as shown in FIG. 3. In addition, those skilled in the art would easily realize that the apparatus for CMP 100 can include more than one approach. For example, in some embodiments, the apparatus for CMP 100 can include the cooling device 116a coupled to the slurry dispenser 108 and the cooling device 116b proximate to the polishing surface 104s of the polishing pad 104. In some embodiments, the apparatus for CMP 100 can include the cooling devices 116a coupled to the slurry dispenser 108 and the cooling device 116c coupled to the wafer carrier 106. In some embodiments, the apparatus for CMP 100 can include the cooling devices 116c coupled to the wafer carrier 106 and the cooling device 116b proximate to the polishing surface 104s of the polishing pad 104. In other embodiments, the apparatus for CMP 100 can include the cooling device 116a coupled to the slurry dispenser 108, the cooling device 116b proximate to the polishing surface 104s, and the cooling device 116c coupled to the wafer carrier 106.

Figure 4:
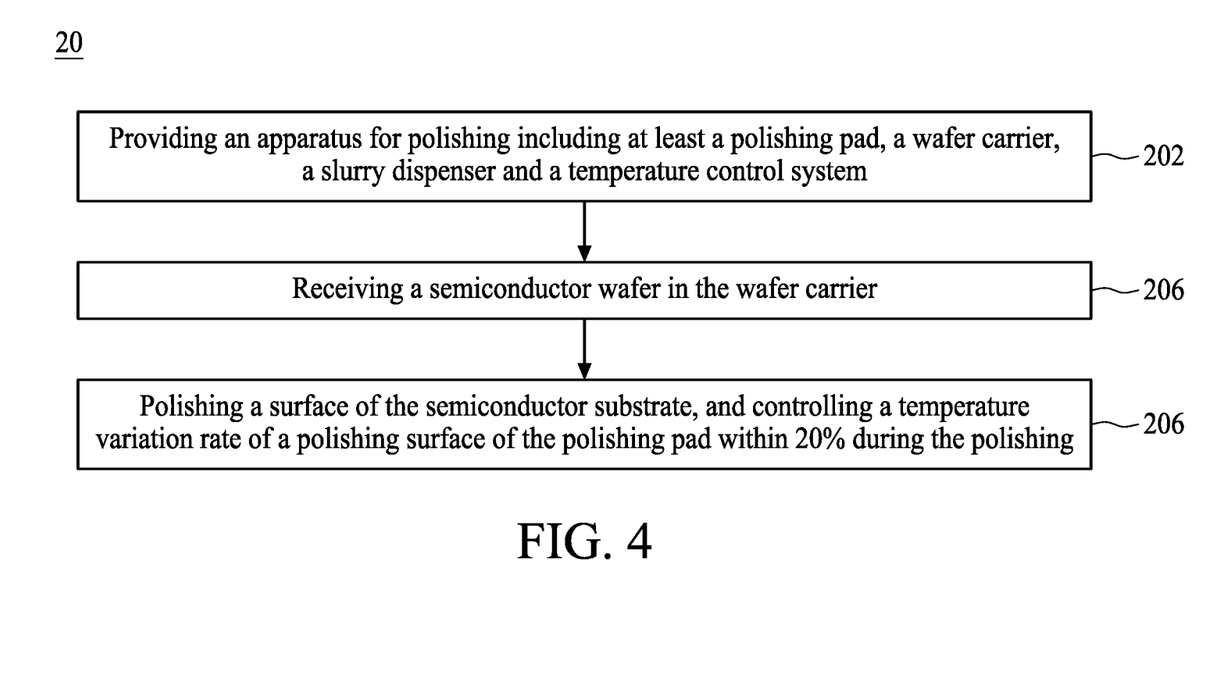
FIG. 4 is a flowchart representing a method for CMP according to aspects of the present disclosure.

FIG. 4 is a flowchart representing a method for CMP 20. The method for CMP 20 includes an operation 202, providing an apparatus for polishing. The apparatus for polishing can include the apparatus for CMP 100 as mentioned above. For example, the apparatus for polishing can include at least the polishing pad 104, the wafer carrier 106, the slurry dispenser 108, and the temperature control system 110. The method for CMP 20 further includes an operation 204, receiving a semiconductor wafer in the wafer carrier 106. The method for CMP 20 further includes an operation 206, polishing a surface of the semiconductor wafer, and controlling a temperature variation of a polishing surface of the polishing pad to within 20% during the polishing operation. In some embodiments, the temperature variation is controlled by the temperature control system 110. In some embodiments, the polishing operation is performed to remove a portion of metal material from the surface of the semiconductor substrate, but the disclosure is not limited thereto. The method for CMP 20 will be further described according to one or more embodiments. It should be noted that the operations of the method for CMP 20 may be rearranged or otherwise modified within the scope of the various aspects. It should further be noted that additional operations may be provided before, during, and after the method for CMP 20, and that some other operations may be only briefly described herein. Thus, other implementations are possible within the scope of the various aspects described herein.

As mentioned above, the temperature control system 110 includes the temperature sensor 112, the temperature controller 114 and the cooling device 116a, 116b and/or 116c. The temperature control system 110 provides a coolant to reduce a temperature of the polishing surface 104s through the cooling device 116a, 116b and/or 116c.

Figure 5:
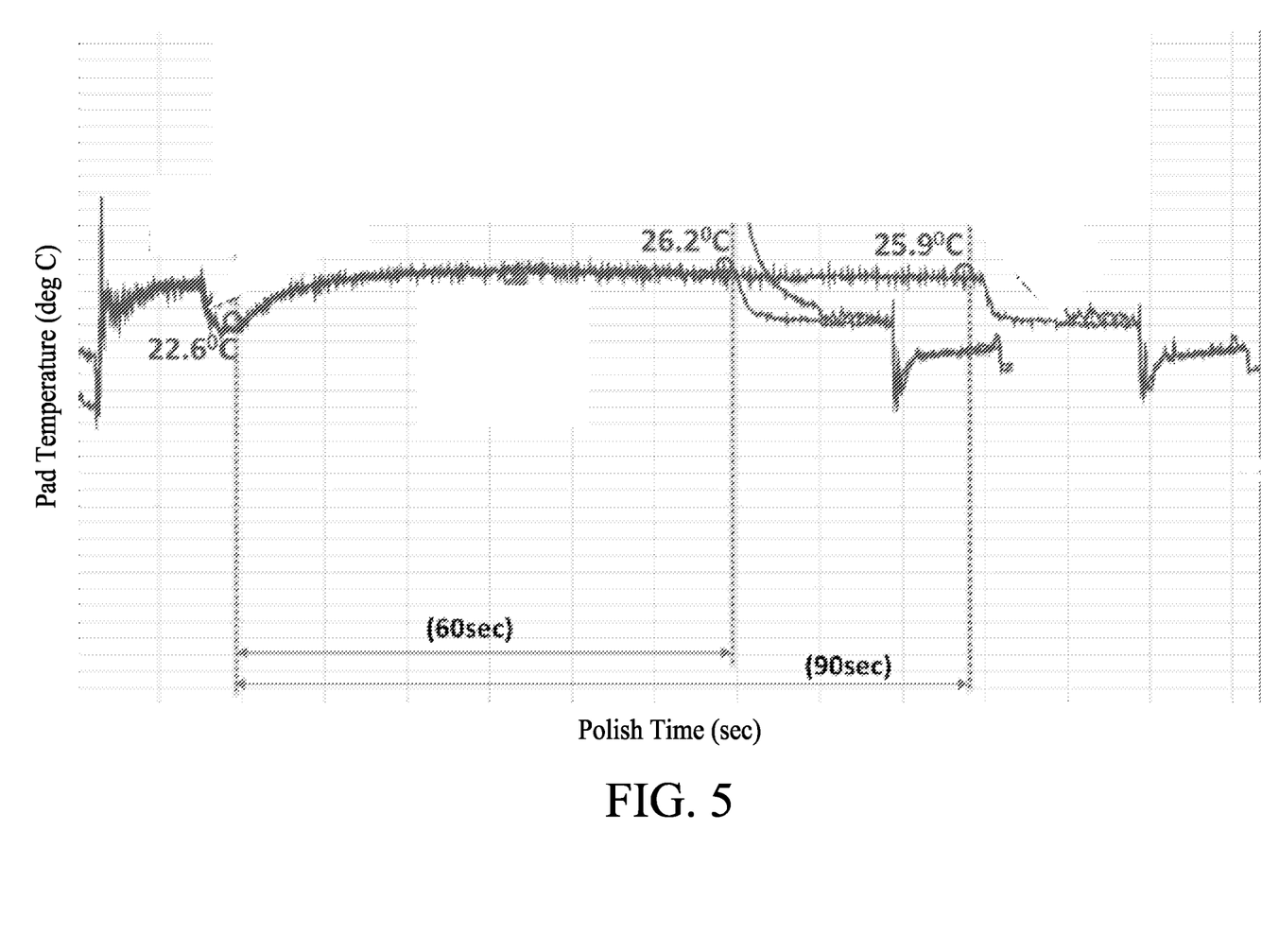
FIG. 5 is a graph showing a temperature of a polishing surface detected during a polishing operation according to aspects of the present disclosure.

In some embodiments, the coolant is provided to the slurry dispenser 108 to reduce the temperature of an abrasive slurry through the cooling device 116a, as shown in FIG. 1. Therefore, when the abrasive slurry is dispensed onto the polishing surface 104s of the polishing pad 104, it immediately reduces the temperature of the polishing surface 104s. In some embodiments, the abrasive slurry is dispensed onto the polishing surface 104s prior to the polishing operation, and thus a starting temperature of the polishing operation is reduced, as shown in FIG. 5. In some embodiments, the starting temperature is reduced to approximately 22° C., but the disclosure is not limited thereto. It should be noted that the CMP operation includes chemical action involving material dissolution and mechanical action involving polishing rotation and pressure, and therefore the temperature of the polishing surface 104s is increased during the polishing operation in embodiments without the temperature control system 110. In some embodiments, the temperature controller 114 of the temperature control system 110 instructs the cooling device 116a to provide the coolant to the slurry dispenser 108, and therefore the polishing surface 104s is cooled by the low-temperature abrasive slurry. Accordingly, temperature variation of the polishing surface 104s is controlled to within 20%. For example, in some embodiments, the starting temperature of the polishing surface 104s is 22.6° C., the highest temperature of the polishing surface 104s detected during the polishing operation is 26.2° C., and the temperature variation is 15.9%. In some embodiments, the starting temperature of the polishing operation is 22.6° C., the highest temperature of the polishing surface 104s detected during the polishing operation is 25.9° C., and the temperature variation is 14.6%.

Still referring to FIG. 5, in some embodiments, when the temperature of the polishing surface 104s is too low, the temperature controller 114 instructs the cooling device 116a to stop providing the coolant to the slurry dispenser 108, and thus the temperature of the polishing surface 104s can be increased.

Briefly, by providing or stopping providing the coolant to the slurry dispenser 108, the temperature control system 110 can make real-time changes during the polishing operation, and the temperature variation of the polishing surface 104s is monitored and controlled to within 20% during the polishing operation.

In some embodiments, the cooling device 116b is configured to be proximate to the polishing surface 104s, and the coolant is provided to the cooling device 116b in order to reduce the temperature of the polishing surface 104s by radiation as shown in FIG. 2, and thus a starting temperature of the polishing operation is reduced, as shown in FIG. 5. As mentioned above, the CMP operation includes chemical action and mechanical action, and therefore the temperature of the polishing surface 104s may be increased during the polishing operation. In some embodiments, the temperature controller 114 of the temperature control system 110 instructs the cooling device 116b to provide the coolant over the polishing surface 104s, and therefore the polishing surface 104s is cooled by radiation. Accordingly, temperature variation of the polishing surface 104s is controlled to within 20%. For example, in some embodiments, the starting temperature of the polishing surface 104s is 22.6° C., the highest temperature of the polishing surface 104s detected during the polishing operation is 26.2° C., and the temperature variation is 15.9%. In some embodiments, the starting temperature of the polishing surface 104s is 22.6° C., the highest temperature of the polishing surface 104s detected during the polishing operation is 25.9° C., and the temperature variation is 14.6%.

Still referring to FIG. 5, in some embodiments, when the temperature of the polishing surface 104s is too low, the temperature controller 114 instructs the cooling device 116b to stop providing the coolant, and thus the temperature of the polishing surface 104s can be increased.

Briefly, by providing or stopping providing the coolant by the cooling device 106b, the temperature control system 110 can make real-time changes during the polishing operation, and the temperature variation of the polishing surface 104s is monitored and controlled to within 20% during the polishing operation.

In some embodiments, the coolant is provided to the wafer carrier 106 to reduce the temperature of the semiconductor wafer through the cooling device 116c as shown in FIG. 3. Therefore, when the polishing surface 104s contacts the to-be-polished surface of the semiconductor wafer, the temperature of the polishing surface 104s is reduced. As mentioned above, the CMP operation includes chemical action involving material dissolution and mechanical action involving polishing rotation and pressure, and therefore the temperature of the polishing surface 104s may be increased during the polishing operation. In some embodiments, the temperature controller 114 of the temperature control system 110 instructs the cooling device 116c to provide the coolant to the wafer carrier 106, and therefore the polishing surface 104s is cooled by the low-temperature semiconductor wafer. Accordingly, temperature variation of the polishing surface 104s is controlled to within 20%. For example, in some embodiments, the starting temperature of the polishing surface 104s is 22.6° C., the highest temperature of the polishing surface 104s detected during the polishing operation is 26.2° C., and the temperature variation is 15.9%. In some embodiments, the starting temperature of the polishing operation is 22.6° C., the highest temperature of the polishing surface 104s detected during the polishing operation is 25.9° C., and the temperature variation is 14.6%.

Still referring to FIG. 5, in some embodiments, when the temperature of the polishing surface 104s is too low, the temperature controller 114 instructs the cooling device 116a to stop providing the coolant to the wafer carrier 106, and thus the temperature of the polishing surface 104s can be increased.

Briefly, by providing or stopping providing the coolant to the wafer carrier 106, the temperature control system 110 can make real-time changes during the polishing operation, and the temperature variation of the polishing surface 104s is monitored and controlled to within 20% during the polishing operation.

In some embodiments, the temperature control system 110 can include any combination of the cooling device 116a, 116b and 116c to monitor and control the temperature variation of the polishing surface 104s.

Figure 6:
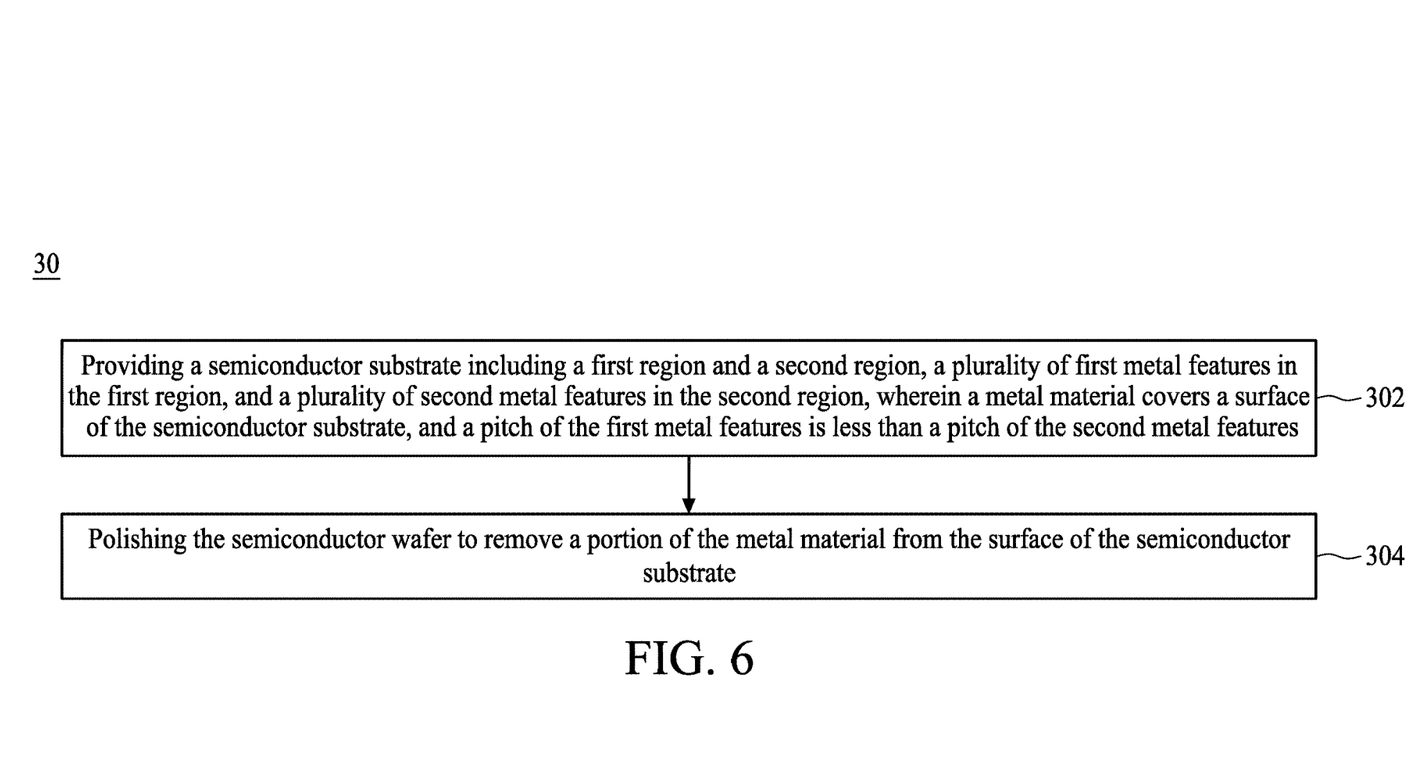
FIG. 6 is a flowchart representing a method for polishing a semiconductor substrate according to aspects of the present disclosure.

FIG. 6 is a flowchart representing a method 30 for polishing a semiconductor substrate according to aspects of the present disclosure. The method 30 includes an operation 302, providing a semiconductor substrate including a first region and a second region, a plurality of first metal features in the first region, a plurality of second metal features in the second region, and a metal material covering a surface of the semiconductor substrate. The method 30 further includes an operation 302, polishing the semiconductor wafer to remove a portion of the metal material from the surface of the semiconductor substrate. In some embodiments, a pitch of the first metal features is less than a pitch of the second metal features. The method 30 will be further described according to one or more embodiments. It should be noted that the operations of the method 30 may be rearranged or otherwise modified within the scope of the various aspects. It should further be noted that additional operations may be provided before, during, and after the method 30, and that some other operations may be only briefly described herein. Thus, other implementations are possible within the scope of the various aspects described herein.

In some embodiments, the polishing operation can be a metal polishing operation. In some embodiments, the metal polishing operation is performed to form metal gates. In some embodiments, a gate last operation (also referred to as a replacement poly gate (RPG) operation), is adopted to form the metal gates. In the gate last operation, a dummy dielectric layer and a dummy poly gate structure can be formed over a semiconductor wafer 400 and may be followed by a CMOS operation after a deposition of an interlayer dielectric (ILD) layer. The dummy dielectric layer and the dummy poly gate structures are removed to form a gate trench, and a high-k gate dielectric layer (not shown) and a metal gate structure are formed in the gate trenches. Next, the polishing operation is performed to remove excess or superfluous metal materials from the semiconductor wafer. In some embodiments, the polishing operation is performed to form interconnects. In some embodiments, metal layers for conductor lines are formed in single or dual damascene operations. For example, a semiconductor wafer 400 including an ILD layer or IMD layer is provided. A plurality of trenches are formed in the dielectric layer and filled with a metal material. For example, copper, copper alloy, aluminum or other metal materials are used to fill the trenches and form the conductor lines. Next, the polishing operation is performed to remove excess or superfluous metal materials from the semiconductor wafer (e.g., the excess metal material outside of the gate trenches or trenches for forming the conductor lines), thereby exposing and making a substantially coplanar top surface.

In some embodiments, an abrasive slurry for metal polishing may be suspended in a mild etchant, such as potassium or ammonium hydroxide, and may be applied to the polishing surface 104s. In some embodiments, the abrasive slurry includes ferric nitrate, peroxide, potassium iodate, ammonia, silica, and/or alumina, but other slurry materials are applicable.

Figure 7A:
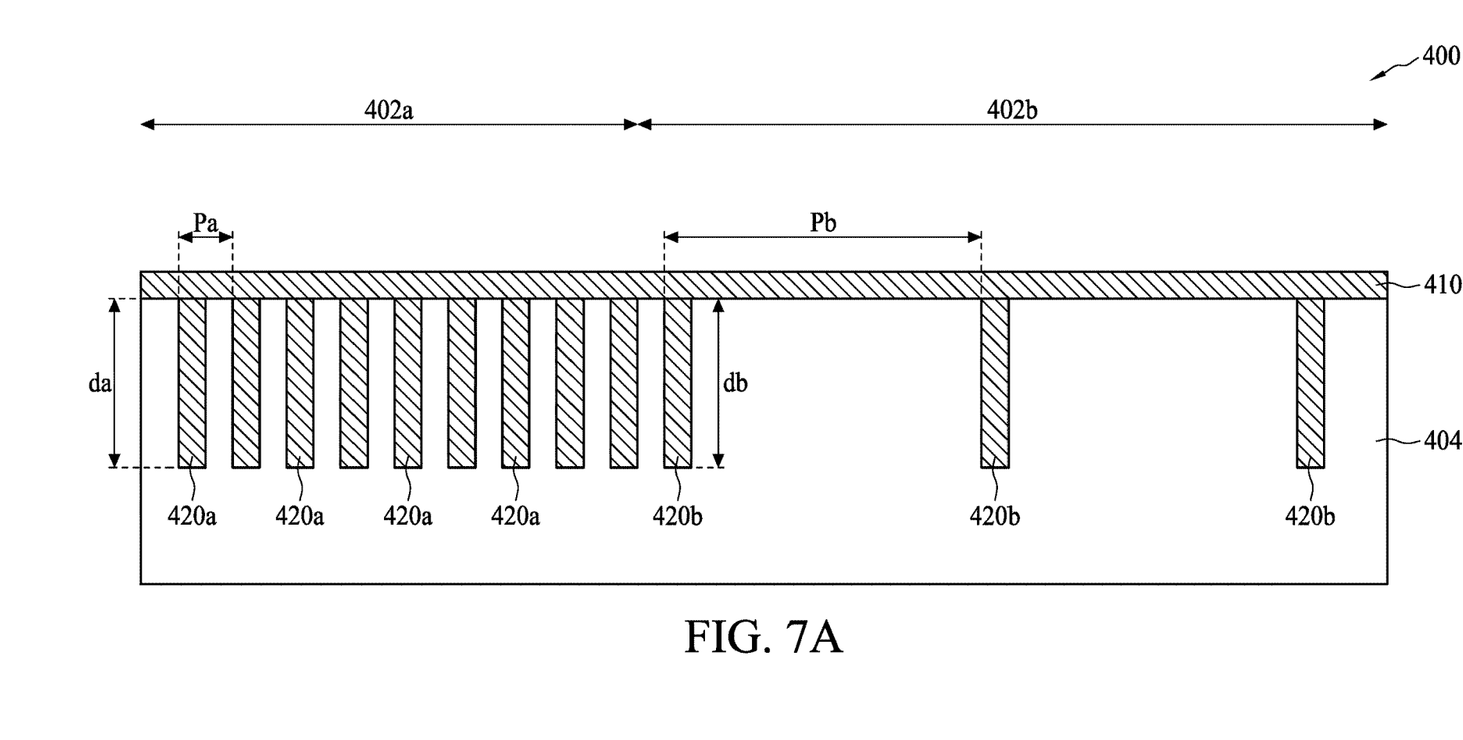
FIGS. 7A and 7B are schematic drawings illustrating a semiconductor substrate at various fabrication stages constructed according to aspects of the present disclosure in one or more embodiments.
Figure 7B:
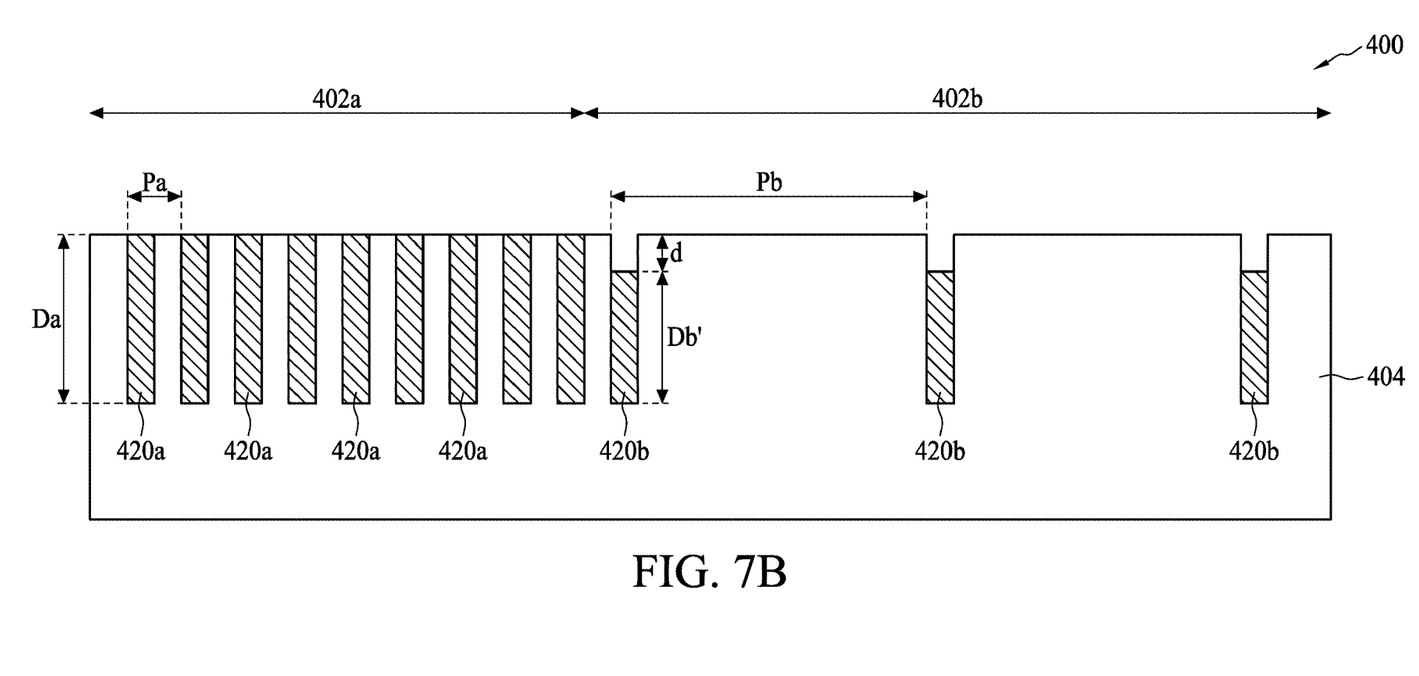

FIGS. 7A and 7B are schematic drawings illustrating a semiconductor substrate 400 at various fabrication stages constructed according to aspects of one or more embodiments of the present disclosure. In some embodiments, a semiconductor substrate 400 is provided according to operation 302. The semiconductor substrate 400 includes a first region 402a and a second region 402b. The semiconductor substrate 400 includes a plurality of first metal features 420a formed in the first region 402a and a plurality of second metal features 420b formed in the second region 402b. In some embodiments, the first metal features 420a and the second metal features 420b can be metal gates. In some embodiments, the first metal features 420a and the second metal features 420b can be the conductor lines of the interconnects. In some embodiments, the first metal features 420a and the second metal features 420b can be any conductive elements required in an integrated circuit. In some embodiments, the first metal features 420a and the second metal features 420b can be formed by filling trenches within a dielectric layer over the semiconductor substrate 400 with a metal material 410, and the metal material 410 may overfill the trenches and cover a surface 404 of the semiconductor substrate 400, as shown in FIG. 7A. In some embodiments, the metal material 410 includes copper (Cu), but the disclosure is not limited thereto. It should be noted that the first metal features 420a in the first region 402a have a first pitch (i.e., a sum of the feature size and the width of a space between features) Pa, the second metal features 420b in the second region 402b have a second pitch Pb, and the first pitch Pa is less than the second pitch Pb. The first region 402a is therefore referred to as a dense region 402a, and the second region 402b is referred to as an iso region 402b. Additionally, the first metal features 420a have a first depth da and the second metal features 420b have a second depth db. In some embodiments, the first depth da and the second depth db are the same, but the disclosure is not limited thereto.

In operation 304, the semiconductor substrate 400 is polished to remove a portion of the metal material 410 from the surface 404 of the semiconductor substrate 400. The polishing operation is performed in an apparatus for polishing, and the apparatus for polishing can include the apparatus for CMP 100 as mentioned above. For example, the apparatus for CMP can include at least the polishing pad 104, the wafer carrier 106, the slurry dispenser 108, and the temperature control system 110. In some embodiments, the polishing operation is performed during a polishing period, wherein the polishing period is between approximately 60 seconds and approximately 90 seconds, but the disclosure is not limited thereto.

As mentioned above, the temperature control system 110 includes the temperature sensor 112, the temperature controller 114 and the cooling device 116a, 116b and/or 116c. By detecting the temperature of the polishing surface 104s of the polishing pad 104, providing or stopping providing the coolant to the slurry dispenser 108 by the cooling device 116a, providing the coolant over the polishing surface 104s of the polishing pad 104 by the cooling device 116b, and/or providing the coolant to the wafer carrier 106 by the cooling device 116c according to instruction from the temperature controller 114, the temperature control system 110 can make real-time changes during a polishing operation, and the temperature variation of the polishing surface 104s is monitored and controlled to within 20% during the polishing operation.

It should be noted that after removing the metal material from the surface of the semiconductor substrate, both of the first metal features and the second metal features are polished before the polishing operation is stopped. The removal amount (RA) is a product of the polishing period and the removal rate. Further, the polishing operation has an ideal removal rate, which can be calculated by the rotation speeds of the polishing pad 104 and the wafer carrier, and the etching rate of the abrasive slurry. However, it is found that feature density influences the removal rate. In some embodiments, the lower feature density in the iso region increases the ideal removal rate, and thus removal amount of the metal features in the iso region will be greater than that of the metal features in the dense region. Further, temperature variation also influences the removal rate. In some embodiments, it is found that a greater temperature variation corresponds to a larger difference between the removal rates in the iso region and the removal rate of the dense region. As mentioned above, the difference between the removal rates leads to different removal amounts. In some embodiments, when no temperature control mechanism is adopted during the polishing operation, the temperature of the polishing surface 104s is gradually increased, the temperature variation is therefore increased, and the removal amount of the metal features in the iso region is greater than 50%. Such excess removal of metal leads to electrical failure by causing discontinuous electrical communication pathways.

Please refer to FIG. 7B. As mentioned above, after removing the excess metal material 410 from the surface 404 of the semiconductor substrate 400, both of the first metal features 420a and the second metal features 420b are polished before the polishing operation is stopped. In some embodiments, the polishing method 30 is provided to monitor and control the temperature variation to within 20%, the removal rate in the iso region 402b is reduced, and thus removal amount of the second metal features 420b in the iso region 402b is reduced. In some embodiments, a removal amount of the second metal features 420b is less than 50%.

In some embodiments, the wafer carrier 106 and the semiconductor wafer 400 are lifted, and the polishing pad 104 is generally subjected to a high-pressurized spray of deionized wafer to remove slurry residue and other particulate matter from the polishing surface 104s after the polishing operation is performed. In some embodiments, the other particulate matter may include wafer residue, abrasive slurry, oxide, organic contaminants, mobile ions and metallic impurities. The semiconductor wafer 400 is then subjected to a post-CMP cleaning operation.

The present disclosure provides a temperature-controlled apparatus for CMP that is able to mitigate metal corrosion and dishing. By implementing a temperature control system, such as a cooling system, temperature of the polishing surface of the polishing pad is monitored and controlled in real time. Consequently, a polishing removal rate (RR) in an iso region is reduced and thus metal corrosion and dishing in the iso region are both mitigated.

In some embodiments, an apparatus for CMP is provided. The apparatus for CMP includes a wafer carrier retaining a semiconductor wafer during a polishing operation, a slurry dispenser dispensing an abrasive slurry, and a temperature control system monitoring and controlling a temperature variation during the polishing operation. The temperature control system includes a temperature sensor detecting a temperature during the polishing operation and providing a signal corresponding to the temperature, a temperature controller coupled to the temperature sensor and receiving the signal from the temperature sensor, and a cooling device coupled to the temperature controller and providing a coolant to the apparatus for CMP.

In some embodiments, a method for CMP is provided. The method for CMP includes the following operations. An apparatus for CMP including at least a polishing pad, a wafer carrier, a slurry dispenser and a temperature control system is provided. A semiconductor wafer is received in the wafer carrier. A surface of the semiconductor wafer is polished. The temperature variation of a polishing surface of the polishing pad is controlled to within 20% by the temperature control system during performing of the polishing operation.

In some embodiments, a method for polishing a semiconductor substrate is provided. The method includes the following operations. A semiconductor substrate is provided. The semiconductor substrate includes a first region and a second region, a plurality of first metal features in the first region, and a plurality of second metal features in the second region. A metal material covers a surface of the semiconductor substrate. A pitch of the first metal features is less than a pitch of the second metal features. The semiconductor substrate is polished to remove a portion of the metal material from the surface of the semiconductor substrate. A removal amount of the second metal features is less than 50%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for chemical mechanical polishing (CMP) comprising:
    a wafer carrier retaining a semiconductor wafer during a polishing operation;
    a slurry dispenser dispensing an abrasive slurry; and
    a temperature control system monitoring and controlling a temperature variation during the polishing operation, the temperature control system comprising:
        a temperature sensor above a polishing pad, wherein the temperature sensor detects a temperature of a polishing surface of the polishing pad during the polishing operation and provides a signal corresponding to the temperature;
        a temperature controller coupled to the temperature sensor and receiving the signal from the temperature sensor;
        a cooling device coupled to the temperature controller and providing a coolant to the apparatus for CMP; and
        a loop connecting the cooling device and the wafer carrier, and surrounding an outer surface of the wafer carrier.

2. The apparatus of claim 1, wherein the temperature controller instructs the cooling device to provide the coolant or stop providing the coolant according to the signal from the temperature sensor.

3. The apparatus of claim 1, further comprising a platen, wherein the cooling device is disposed over the platen.

4. The apparatus of claim 3, wherein the polishing pad is disposed over the platen.

5. The apparatus of claim 1, wherein the coolant comprises fluid or gas.

6. The apparatus of claim 1, wherein the loop is capable of circulating the coolant.

7. The apparatus of claim 1, wherein the temperature sensor comprises an infra-red (IR) sensor.

8. The apparatus of claim 1, wherein a portion of the loop is disposed over and separated from the polishing surface of the polishing pad.

9. An apparatus for chemical mechanical polishing (CMP) comprising:
    a wafer carrier retaining a semiconductor wafer during a polishing operation;
    a platen;
    a temperature sensor above a polishing pad disposed over the platen, wherein the temperature sensor detects a temperature of a polishing surface of the polishing pad during the polishing operation and providing a signal corresponding to the temperature;
    a temperature controller coupled to the temperature sensor and receiving the signal from the temperature sensor;
    a cooling device coupled to the temperature controller and providing a coolant to the wafer carrier; and
    a loop connecting the cooling device and the wafer carrier, and surrounding an outer surface of the wafer carrier.

10. The apparatus of claim 9, wherein the temperature sensor comprises an infra-red (IR) sensor.

11. The apparatus of claim 9, wherein the temperature controller instructs the cooling device to provide the coolant or stop providing the coolant according to the signal from the temperature sensor.

12. The apparatus of claim 9, wherein the coolant comprises a fluid or a gas.

13. The apparatus of claim 9, wherein the loop is coupled to the cooling device and the wafer carrier, and is capable of circulating the coolant between the cooling device and the wafer carrier.

14. An apparatus for chemical mechanical polishing (CMP) comprising:
- a wafer carrier;
- a platen accommodating a polishing pad;
- a temperature sensor disposed above the polishing pad, wherein the temperature sensor detects a temperature of a polishing surface of the polishing pad during a polishing operation and provides a signal corresponding to the temperature;
- a temperature controller coupled to the temperature sensor and receiving the signal from the temperature sensor;
- a cooling device; and
- a first loop coupled to the cooling device and the wafer carrier and surrounding an outer surface of the wafer carrier, wherein the first loop is capable of circulating a coolant between the wafer carrier and the cooling device.

15. The apparatus of claim 14, wherein the temperature sensor comprises an infra-red (IR) sensor.

16. The apparatus of claim 14, wherein the temperature controller instructs the cooling device to provide the coolant or stop providing the coolant according to the signal from the temperature sensor.

17. The apparatus of claim 14, wherein the coolant comprises a fluid.

18. The apparatus of claim 14, wherein the coolant comprises a gas.

* * * * *